US006765450B2

(12) United States Patent
Howard et al.

(10) Patent No.: US 6,765,450 B2
(45) Date of Patent: Jul. 20, 2004

(54) COMMON MODE REJECTION IN DIFFERENTIAL PAIRS USING SLOTTED GROUND PLANES (75) Inventors: Gregory Eric Howard, Dallas, TX (US); Leland Swanson, McKinney, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 10/184,676

(22) Filed: Jun. 28, 2002

(65) Prior Publication Data

US 2004/0000959 A1 Jan. 1, 2004

(51) Int. Cl.[7] .............................. H01P 5/00; H01Q 13/10
(52) U.S. Cl. ........................................ 333/4; 343/767
(58) Field of Search ..................... 333/4, 238; 343/767, 343/727, 700 MS; 29/600; 257/531; 342/368

(56) References Cited

U.S. PATENT DOCUMENTS

| 4,038,742 A | * | 8/1977 | Kimball et al. ............... 29/600 |
| 5,138,287 A | | 8/1992 | Domokos et al. |
| 5,400,042 A | * | 3/1995 | Tulintseff ..................... 343/727 |
| 6,037,903 A | * | 3/2000 | Lange et al. ......... 343/700 MS |
| 6,292,133 B1 | * | 9/2001 | Lynch ........................ 342/368 |
| 6,392,600 B1 | * | 5/2002 | Carson et al. ....... 343/700 MS |
| 6,462,710 B1 | * | 10/2002 | Carson et al. ....... 343/700 MS |
| 6,621,141 B1 | * | 9/2003 | Van Schuylenbergh et al. .......................... 257/531 |
| 6,624,729 B2 | * | 9/2003 | Wright et al. ............... 333/238 |

* cited by examiner

Primary Examiner—Patrick Wamsley
(74) Attorney, Agent, or Firm—W. Daniel Swayze, Jr.; W. James Brady; Frederick J. Telecky, Jr.

(57) ABSTRACT

In high-speed semiconductor packaging, differential pair transmission lines 605 are used to receive incoming signals carried using differential signaling. Common mode noise can decrease the frequency at which these signals are clocked. The use of slots 620 formed in the ground (or power plane) 609 of the substrate and lying perpendicularly (and equally spaced) underneath the differential pair 605 improves the common mode rejection of the differential pair 605 by increasing the common mode impedance without affecting the differential mode impedance. The use of slots 620 does not require modifications to the packaging, and only minor modifications to the substrate.

26 Claims, 5 Drawing Sheets

COMMON MODE REJECTION IN DIFFERENTIAL PAIRS USING SLOTTED GROUND PLANES

FIELD OF THE INVENTION

This invention relates generally to high frequency signaling in packaged integrated circuits, and particularly to increasing the common mode rejection in high-frequency signals that use differential signaling.

BACKGROUND OF THE INVENTION

A common method of providing input signaling in a semiconductor package is through the use of differential signaling using differential pair transmission lines. In differential pair transmission lines, there is a pair of conductors and usually a solid ground reference plane. Depending on the signaling mode, the signal being carried on the conductor pair and the ground reference plane changes. In a differential mode signaling, a pair of conductors is used for one signal, with a first conductor carrying a current into the load and a second conductor carrying a return current. The return current may be thought of as a current flowing away from the load. There is no current on the ground reference plane in differential signaling mode. The name differential signaling is derived from the fact that the information on the signal is transmitted as a difference of the two currents. In common mode signaling, the common mode signal is carried on both conductors (with half of the overall current on each conductor) and the common mode return current is carried on the ground reference plane. Should both differential and common mode signaling be used in a differential pair transmission line, the conductor pair will carry both common mode signal and the differential mode signal, while the ground reference plane will carry the common mode return current.

The pair of conductors used in differential signaling is commonly referred to as a differential pair transmission line or simply, a differential pair. Each differential pair may be characterized by its characteristic impedance. For example, the differential pair has an odd mode impedance, a differential mode impedance, and an even or common mode impedance. An odd mode or differential mode is defined by the current in one conductor of the differential pair being equal and opposite of the current in the other conductor of the differential pair, with no current being carried by the ground conductor. An even mode is defined by the current in both conductors of the pair being in the same direction and the current in the ground plane in the opposite direction. A differential pair's odd mode impedance is defined as the ratio of voltage to current from one conductor to ground while its differential mode impedance is defined as the ratio of the voltage to current from one conductor to the other. Therefore, if one differential pair's odd mode impedance is 50 ohms, then the pair's differential impedance is two times the odd mode impedance, or 100 ohms, because the differential mode voltage is twice of the odd mode voltage. The even and common mode impedances are both defined as the impedance from one conductor to ground. Typically, a differential pair's odd mode impedance is different from its even mode impedance.

In high-speed applications, the presence of signals clocked at different frequencies increases the overall ground and/or power plane noise. The problem with increased noise on the ground and/or power plane is that when the common mode impedance of the differential pair is similar to its differential mode impedance, then the noise on the ground and/or power plane is optimally coupled to the differential pair. The coupled noise appears as a common mode noise since it is present on both conductors of the differential pair. The input common mode rejection ratio (CMMR) of a differential receiver is frequency dependent and typically decreases with frequency. The CMMR of a differential receiver specifies the ability of the receiver to reject common mode noise. The presence of common mode noise on the differential pair decreases the maximum operating frequency of the circuit, which is limited by the input signal to noise ratio requirements for reliable signal detection. Generally, a high ratio of common mode impedance to differential mode impedance minimizes the ratio of common mode current to differential mode current for a given voltage. Thus, the higher the impedance ratio, the lower the coupling of the common mode noise on the ground and/or power plane to the differential pair.

Several different techniques have been used to help reduce the coupling of the ground and/or power plane noise to the differential pair. One technique specifies the use of ferrite chokes upon which the power plane signal is wrapped. While the ferrite chokes are effective at low signaling frequencies, their effectiveness rapidly drops as the signaling frequencies increase. Additionally, the ferrite chokes can be physically large, therefore limiting their usefulness in applications where minimal size is an important consideration.

Another frequently used technique involves the design of common mode termination impedances, which is used to reject the common mode noise. These techniques typically involve the use of capacitors that couple the differential pair to ground. The capacitors can significantly lower the termination impedance, hence improving the rejection of the noise. Unfortunately, the capacitors will also affect the differential mode impedance if the capacitance on each line of the pair is not carefully balanced. Additionally, the technique requires capacitors with fairly large capacitances to provide a sufficiently low impedance at the frequencies of interest. Large capacitors consume a large amount of real estate, therefore making size an important consideration. Finally, the use of capacitors results in a frequency dependent solution, since the impedance of the capacitors themselves will change with frequency.

Yet another technique increases the separation between the differential pair and the ground plane, i.e., increase the substrate thickness, thereby increasing the common mode impedance of the differential pair. This technique does not significantly affect the differential mode impedance, and therefore can be effective. However, with an increased ground plane separation, it is difficult to design non-differential mode impedances that are close to the system impedance. For example, with non-differential mode characteristic impedances of 50 ohms, the width of the conductors would become excessive, typically 1.2 times the substrate thickness. The large conductor width makes it difficult for packaging designers to route signals and yields an overall increase in the size of the packaging.

A need has therefore arisen for a technique to increase the common mode rejection in differential pairs without increasing the overall cost of the packaging.

SUMMARY OF THE INVENTION

One aspect of the present invention provides a substrate comprising a differential pair transmission line, an equi-potential plane with slots formed in the equi-potential plane, wherein the slots lie beneath the differential pair transmission line and are disposed perpendicularly to the differential pair transmission line's orientation, and a dielectric layer positioned between the differential pair transmission line and the slotted equi-potential plane, the dielectric layer to electrically insulate the differential pair transmission line from the equi-potential plane.

Another aspect of the present invention provides a semiconductor chip comprising a substrate comprising a differential pair transmission line, an equi-potential plane with slots formed in the equi-potential plane, wherein the slots lie beneath the differential pair transmission line and are disposed perpendicularly to the differential pair transmission line's orientation, a dielectric layer positioned between the differential pair transmission line and the slotted equi-potential plane, the dielectric layer to electrically insulate the differential pair transmission line from the equi-potential plane, and the semiconductor chip further comprising a package to hold the substrate, the package comprising a pad coupled to a pin on the package, the pad to provide electrical connectivity between the pin and the differential pair transmission line.

Another aspect of the present invention provides a method for forming a slotted ground plane, the method comprising the steps of forming an equi-potential plane, forming slots in the equi-potential plane, such that the slots run perpendicular to a differential pair transmission line, forming a dielectric layer on the equi-potential plane, and forming the differential pair transmission lines on the dielectric layer The present invention provides a number of advantages. For example, use of a preferred embodiment of the present invention permits an increase in the rejection of common mode noise induced from power and/or ground planes without requiring changes to existing substrate manufacturing processes. Therefore, generally no engineering changes are required in the manufacturing steps that would increase costs.

Also, use of a preferred embodiment of the present invention permits the use of minimal substrate thickness, which is desired for minimizing ground bounce for non-differential mode signals and at the same time retaining good common mode rejection in differential mode signals.

Additionally, use of a preferred embodiment of the present invention does not compromise the line design for a specific characteristic impedance, for example, 50 ohms. This means that line widths are not changed, and routability of the lines is maintained.

Also, use of a preferred embodiment of the present invention permits the use of thinner substrates while maintaining the desired high impedance. Thinner substrates minimize the inductance for signal traces being used. Thinner substrates also allow the use of narrower traces for the non-differential signals and therefore increase package routability.

BRIEF DESCRIPTION OF THE DRAWINGS

The above features of the present invention will be more clearly understood from consideration of the following descriptions in connection with accompanying drawings in which.

DETAILED DESCRIPTION OF ILLUSTRATIVE EMBODIMENTS

The making and use of the various embodiments are discussed below in detail. However, it should be appreciated that the present invention provides many applicable inventive concepts, which can be embodied in a wide variety of specific contexts. The specific embodiments discussed are merely illustrative of specific ways to make and use the invention, and do not limit the scope of the invention.

Figure 1A:
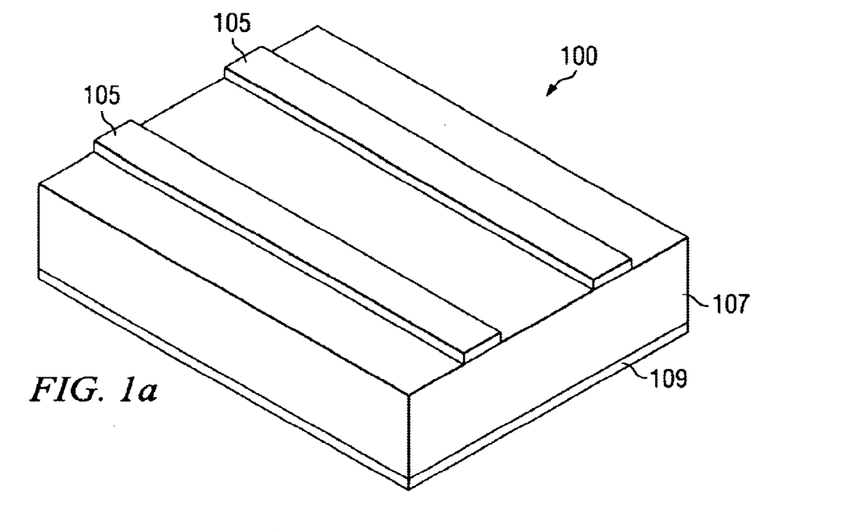
FIGS. 1a–d illustrate isometric, plan, and cross-sectional views of a portion of a substrate 100 with a differential pair transmission line and standard solid ground plane.

Referring now to FIG. 1a, an isometric view of a portion of a substrate 100. The substrate 100 permits the placement of one or more silicon die (not shown) onto a common substrate that are then interconnected and placed into a package. The substrate 100 may be a multi-chip module, in which, more than one integrated circuits are connected electrically into a functional module that is then placed into a package. Alternatively, thermally enhanced cavity type packages (cavity down and cavity up) where a hole in the substrate holds the silicon die can also be used. The substrate 100 permits the efficient packaging of silicon (or other semiconductor) die, saving space and power, while permitting the die to operate at high frequencies. The substrate 100, as displayed, has a pair of conductive lines 105 disposed on a dielectric layer 107, which is lying on a ground (or power) plane 109. While the substrate 100 is displayed in FIG. 1a as being effectively a single conductive layer substrate, it is possible to have multiple conductive layers overlying one another, with dielectric layers separating the conductive layers. A practical limit on the number of layers in a substrate generally being determined by the overall thickness of the substrate, the ability to provide interconnects between the different layers, and the ability to manufacture such substrates.

While the pair of conductive lines 105 can be used to provide electrical conductivity for any signal, when arranged in parallel lines as displayed, the conductive lines 105 may typically be used for high-speed signals (signals that are clocked at high frequencies), such as input signals from sources external to the substrate 100 and package. The pair of conductive lines 105 is commonly referred to as a differential pair. Signals carried on differential pairs can be carried in one of two ways, a first way is known as common mode signaling and current representing the signal flows in the same direction on both conductors of the differential pair. A second way is know as differential mode signaling and the current representing the signal flows in opposite ways on the conductors. For high-speed signaling, due to its greater immunity to noise, differential mode signaling is used more often than common mode signaling.

Figure 1B:
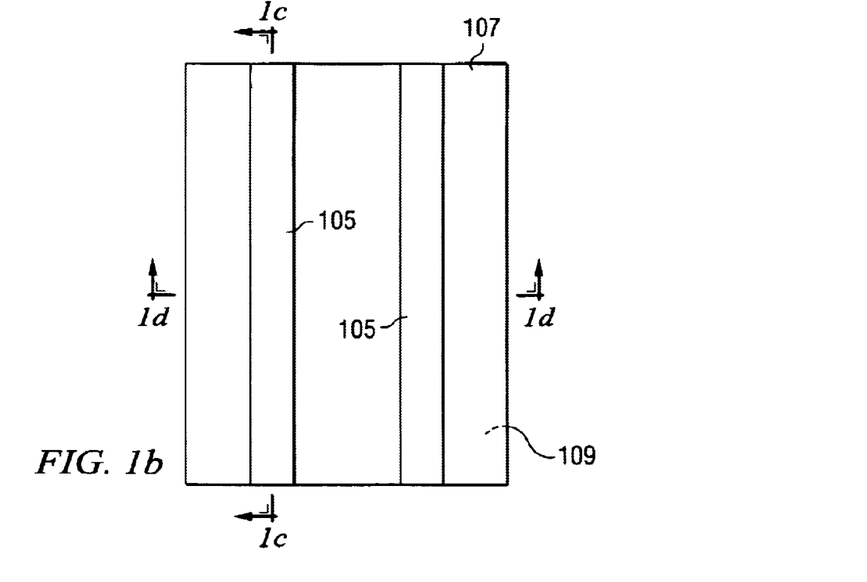
Figure 1C:
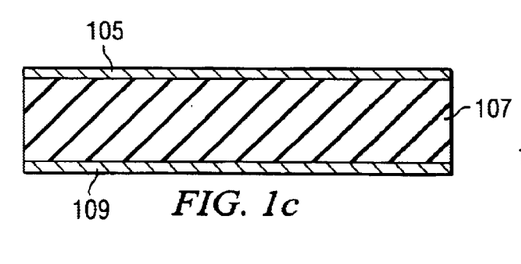
Figure 1D:
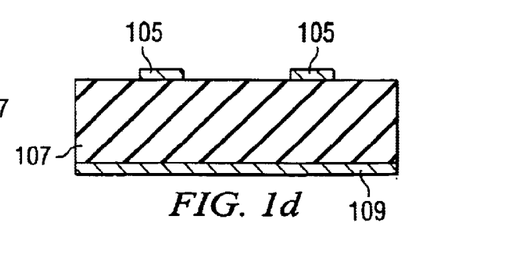

Within a single substrate, there may be many different signals that are clocked at different frequencies. The presence of the many different signals leads to increased noise in the ground and/or power planes of the substrate. The noise on the ground and/or power planes may be induced onto the differential pair 105. Even if the signals are transmitted on the differential pair 105 in a differential mode, common mode noise on the differential pair 105 can reduce the maximum clocking frequency of the signals being transmitted on the differential pair 105. The reduction of maximum operating frequency is due to the limited common mode rejection of receivers receiving the signal carried on the differential pair 105, especially at increased frequencies FIGS. 1b–d present a top view (FIG. 1b), a cross-sectional view along dashed line C–C' (FIG. 1c), and a cross-sectional view along dashed line (D–D') (FIG. 1d) of the substrate 100. Notice that in FIG. 1b, the dielectric layer 107 is not shown to properly display the relationship between the differential pair 105 and the ground plane 109. These figures present views of a fairly typical arrangement for a differential pair 105, dielectric layer 107, and a ground plane 109.

One way to reduce the inductance of the noise present on the ground and/or power planes onto the differential pair 105 is to increase (or decrease) the common mode impedance of the differential pair 105 while maintaining the differential mode impedance at the desired level. As discussed previously, one way to increase the common mode impedance is to increase the separation between the differential pair 105 and the ground (or power) plane 109 by increasing the thickness of the dielectric layer 107. Unfortunately, if the dielectric layer is made thicker, a corresponding increase in the widths of the conductors for common mode signals is required, making it harder to route the signals around the substrate and resulting in an increase in the dimensions of the substrate to route the same signal lines.

An alternative method for increasing the common mode impedance of the differential pair 105 is to place slotted ground planes underneath the differential pair 105. Preferably, the slots in the ground planes run perpendicular to the direction of current flow in the differential pair 105 and are equally spaced over the entire length of the differential pair 105. The placement of slots in the ground planes results in an increase in the common mode impedance of the differential pair 105 without affecting the differential mode impedance. The placement and effectiveness of the slots in the ground plane is counter to conventional design techniques, which generally discourage the placement of holes or slots of any kind in the ground plane, especially the portions of the ground plane immediate beneath transmission lines. Typically, circuit designs have used common mode signaling which required the ground plane to carry the return current. Slots and holes in the ground plane block the flow of this return current and therefore represent large reflection points for the transmission line.

Figure 2A:
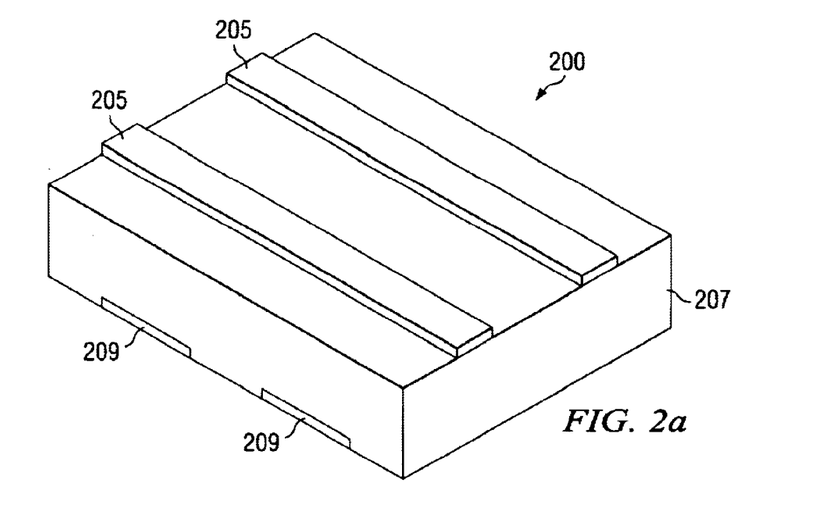
FIGS. 2a–d illustrate isometric, plan, and cross-sectional views of a portion of a substrate 200 with a differential pair transmission line and a slotted ground plane according to a preferred embodiment of the present invention.

Referring now to FIG. 2a, an isometric view of a portion of a substrate 200 with a differential pair transmission line and featuring a slotted ground plane according to a preferred embodiment of the present invention. The substrate 200 is similar to the substrate 100 displayed in FIG. 1a. The substrate 200, as displayed, has a pair of conductive lines (a differential pair) 205 disposed on top of a dielectric layer 207, which in turn, is lying on a slotted ground plane 209. The slotted ground plane 209 is formed by creating slots (not shown in FIG. 2a) into the ground plane at regular intervals and of a specified size. According to a preferred embodiment of the present invention, the slots may be created by cutting or etching the substrate. Preferably, the slots are rectangular in shape and lay perpendicular to the direction of current flow in the differential pair 205. However, according to another preferred embodiment of the present invention, the slots may have rounded corners to alleviate stress during the manufacturing process. FIG. 2a displays a slotted ground plane slots formed by creating slots in the ground plane. Although FIG. 2a does not display the entire differential pair 205, it is preferred that the ground plane is slotted for the entire length of the differential pair 205.

According to another preferred embodiment of the present invention, after the slots are formed in the ground plane, they are filled with some dielectric material. Preferably, the slots are filled with the same material as the dielectric material of the dielectric layer 207. However, it is possible to use different dielectric materials to fill the slots in the ground plane. Examples of other fill material include, but are not limited to: a gas, a dielectric liquid, or some other dielectric solid.

Additionally, the entire slotted ground plane should remain at a common reference voltage level. This may be accomplished by not forming slots that would decouple any portion of the ground plane from any other portion of the ground plane.

Figure 2B:
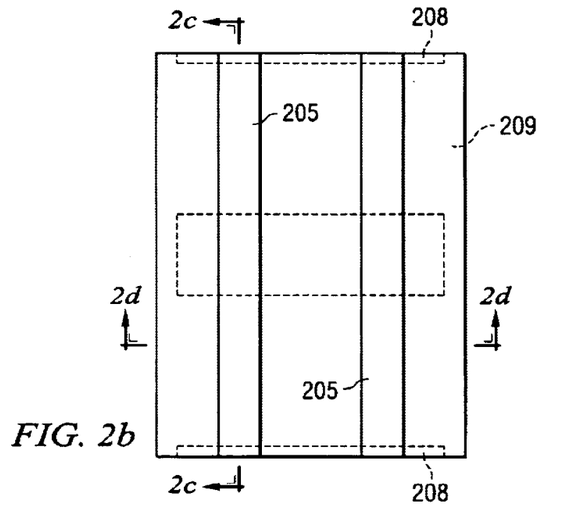
Figure 2C:
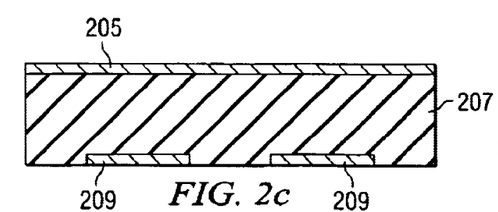
Figure 2D:
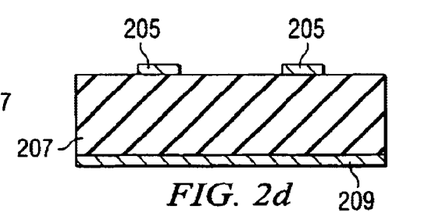

FIGS. 2b–d present a top view (FIG. 2b), a cross-sectional view along dashed line C–C' (FIG. 2c), and a cross-sectional view along dashed line (D–D') (FIG. 2d) of the substrate 200. Notice that in FIG. 2b, the dielectric layer 207 is not shown to properly display the relationship between the differential pair 205 and the ground plane 209. FIG. 2b displays a series of slots 208, formed in the ground plane 209, and creating a slotted ground plane.

Figure 3:
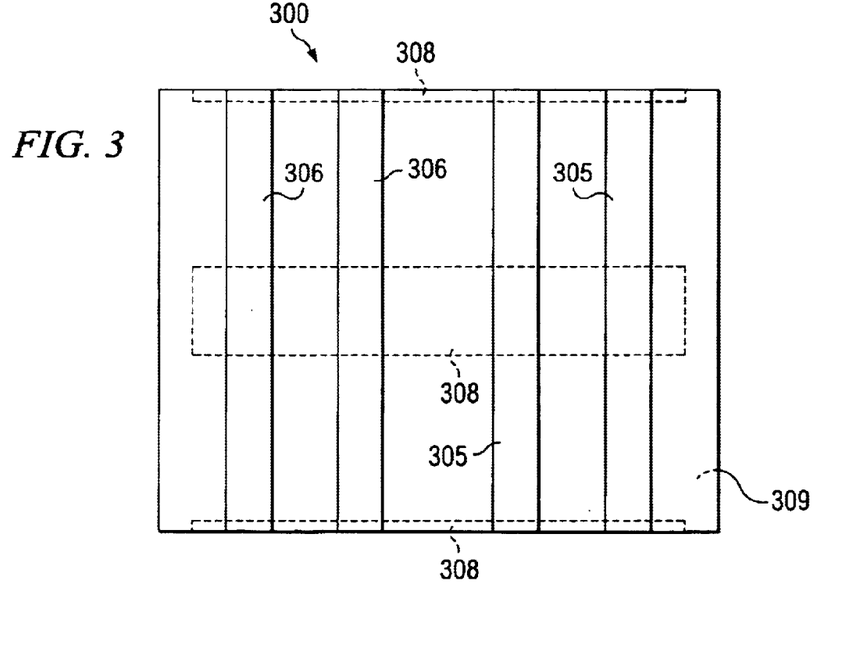
FIG. 3 illustrates a top view of a portion of a substrate 300 with two differential pair transmission lines and a slotted ground plane according to a preferred embodiment of the present invention.

Referring now to FIG. 3, a diagram illustrates a top view of a portion of a substrate 300 with two differential pairs 305 and 306 according to a preferred embodiment of the present invention. Notice that a dielectric layer is present between the differential pairs and the ground plane, but is not shown to better illustrate the relationship between the differential pairs and the ground plane 309. When a substrate has more than one differential pair overlaying the dielectric layer (a common occurrence), then slots 308 formed in the ground plane 309 can be extended so that they lie beneath all differential pairs that are running along one particular orientation. According to a preferred embodiment of the present invention, it is preferred that the slots 308 be kept to a length that is much less than one half of the wavelength of the signal being carried on the differential pair transmission lines, ideally on the order of $\frac{1}{10}^{th}$ of a wavelength in length. When there are differential pairs running in multiple different orientations, then different slots may be used for each orientation. This helps preserve the orthogonal relationship between the ground plane slots and the differential pairs beneath which they lay.

As discussed previously, the net effect of the slotted ground plane is to increase the common mode impedance of the differential pair while maintaining the differential mode impedance of the differential pair. For most applications, the differential pairs are terminated using resistors and capacitors. It is desired that the terminations match the actual impedances to achieve the desired signal transfer. For common mode, the terminating impedance is typically a resistive load that is also used for terminating the differential mode in conjunction with a capacitor coupled to ground.

Figure 4:
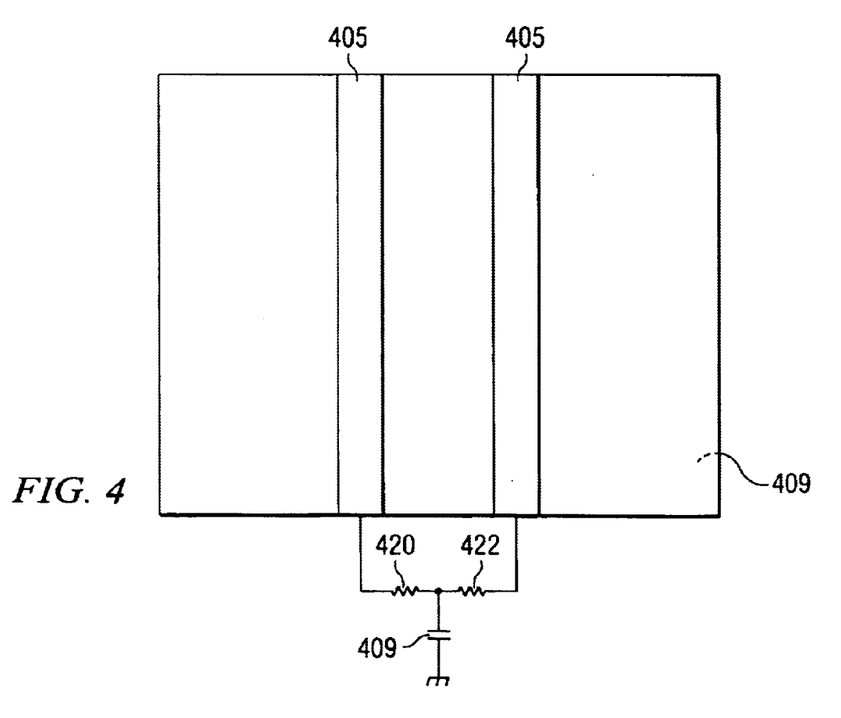
FIG. 4 illustrates the standard termination for a differential pair transmission line.

Referring now to FIG. 4, a diagram illustrates a termination for a differential pair 405. Notice that a dielectric layer is present between the differential pairs and the ground plane, but is not shown to better illustrate the relationship between the differential pairs and the ground plane. As discussed above, the termination includes a pair of resistors 420 and 422 and a capacitor 425 coupling the resistors to ground. The resistors 420 and 422 are set so that they are equal to the odd mode impedance of the differential pair 405, for example, 50 ohms. The two resistors 420 and 422, when combined, provide an impedance equal to the differential mode impedance. The capacitor 425 is sized to provide a proper amount of impedance at the desired operating frequency.

The common mode transmitted power is given by the expression:

$$P_{load}=1-|\Gamma|^2 \quad (1)$$

where $\Gamma$ is the reflection coefficient and given by the expression:

$$\Gamma = \frac{(Z_{oo}-Z_{oe})}{(Z_{oo}+Z_{oe})}$$

where Zoo is the odd mode impedance and Zoe is the even mode impedance. The amount of power transferred is then given by the expression:

$$P_{trans}=10\log_{10}(1-|\Gamma|^2) \quad (2)$$

As an example of determining the common mode noise rejection, assume a typical printed circuit board with a 50 ohm odd mode impedance line (resulting in a 100 ohm differential mode impedance) on a 100 micron thick substrate. With a dielectric with a permittivity of 4.0, a typical line width of 60 microns and a line separation of 90 microns, and a line thickness of 27 microns, the odd mode impedance is 52 ohms, whereas the even mode impedance is 72 ohms. Using equations 1 and 2 above, then $\Gamma=0.1803$ and $P_{load}=0.967$ and $P_{trans}=-0.144$ dB. In the above example, almost the entire common mode noise is transferred, with only a 0.144 dB rejection.

Figure 5:
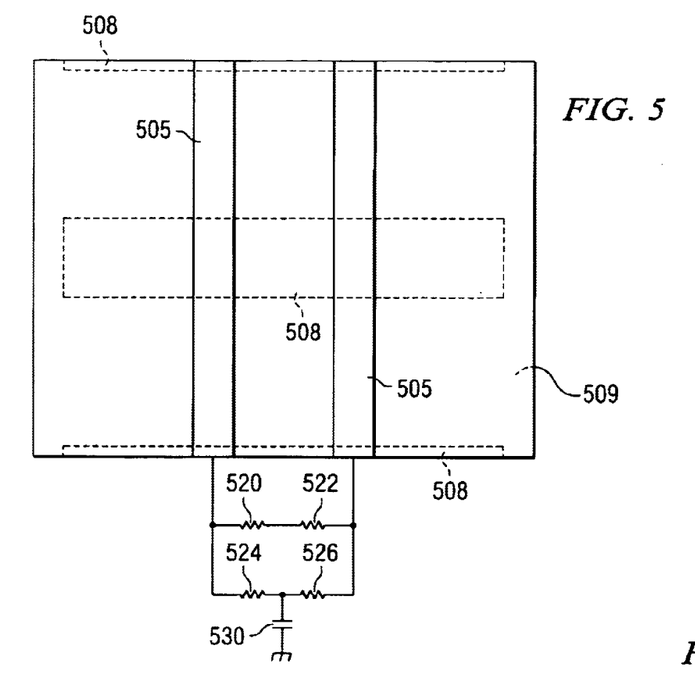
FIG. 5 illustrates a modified termination for a differential pair transmission line on a substrate with a slotted ground plane according to a preferred embodiment of the present invention.

Referring now to FIG. 5, a diagram illustrates an alternate termination structure for a differential pair 505 on a substrate with a slotted ground plane according to a preferred embodiment of the present invention. Notice that a dielectric layer is present between the differential pairs and the ground plane, but is not shown to better illustrate the relationship between the differential pairs and the ground plane. The termination structure uses two pairs of terminating resistors 520, 522, 524, and 526 and a capacitor 530. With the first pair of resistors 520 and 522, each resistor has a resistance equal to $$\frac{Z_{oo}Z_{oe}}{Z_{oe}-Z_{oo}}$$

where Zoo is the odd mode impedance and Zoe is the even mode impedance. With the second pair of resistors 524 and 526, each resistor has a resistance equal to Zoe. The termination structure shown in FIG. 5 performs a better job of matching both the odd and even mode impedance of the differential pair 505 than the termination structure shown in FIG. 4.

Using the same substrate characteristics as specified in the previous example, and with slots in the ground plane that are perpendicular to the differential pair and equal in length of three times the separation of the conductors in the differential pair plus two conductor widths, the values for Zoe is determined to be 118 ohms while the Zoo is 50 ohms. Using equations 1 and 2 above, then $\Gamma=0.405$ and $P_{load}=0.836$ and $P_{trans}=-0.777$ dB. When compared with the example presented above, a significantly larger amount of common mode noise is rejected. For each additional dB of common mode noise rejected, it is possible to clock the signal at clock rate that is 15 percent greater, therefore, any common mode noise that can be eliminated results in an increase in the operating frequency of the devices on substrate.

Figure 6:
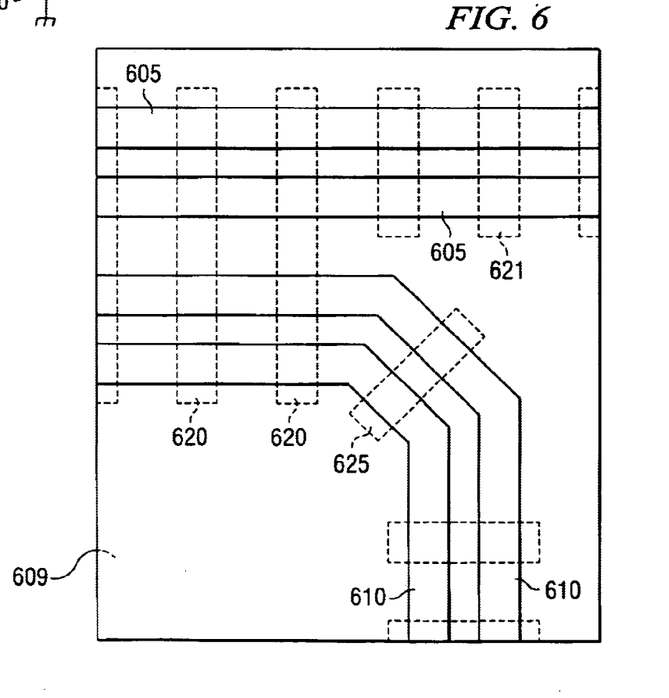
FIG. 6 illustrates a substrate with a slotted ground plane according to a preferred embodiment of the present invention.

Referring now to FIG. 6, a diagram illustrates a substrate with slots formed in a ground plane 609 when there are turns in differential pair transmission lines according to a preferred embodiment of the present invention. Notice that a dielectric layer is present between the differential pairs and the ground plane, but is not shown to better illustrate the relationship between the differential pairs and the ground plane. FIG. 6 displays a pair of differential pair transmission lines 605 and 610. The first differential pair 605 runs horizontally across the substrate while the second differential pair 610 initially runs horizontally but then turns and runs vertically to the bottom edge of the substrate. FIG. 6 illustrates that some slots (for example slots 620) may be shared by the two differential pair transmission lines. However, once the second differential pair transmission line 610 begins its turn, the slots (for example, slot 621) can no longer be shared. This is because the slots must remain perpendicular to the differential pair transmission lines. Instead, an angled slot 625 is used to maintain the perpendicular relationship between the slots and the second differential pair transmission line 610 as it makes a turn. Other slots follow the second differential pair transmission line 610 as it completes its turn and runs vertically.

According to another preferred embodiment of the present invention, the slots formed in the ground plane may be continuous although they do not remain perfectly straight. For example, referring to FIG. 6, slot 621 may be continued so that it comes into contact with slot 625, forming a single slot that has a bend. Although bends can be present in the slots, the restriction that the overall length of the slots be much less than half of the wavelength of the signal being carried on the differential pair transmission line remains. Additionally, the bends in the slots should be restricted such that the angle of the bends does not approach 90 degrees. Although combination bends can be grouped to achieve an overall bend of 90 degrees or more. It is preferred that the differential pair end with the same orientation as it begun. This is to ensure that both conductors in the differential pair have the same overall conductor length.

Figure 7:
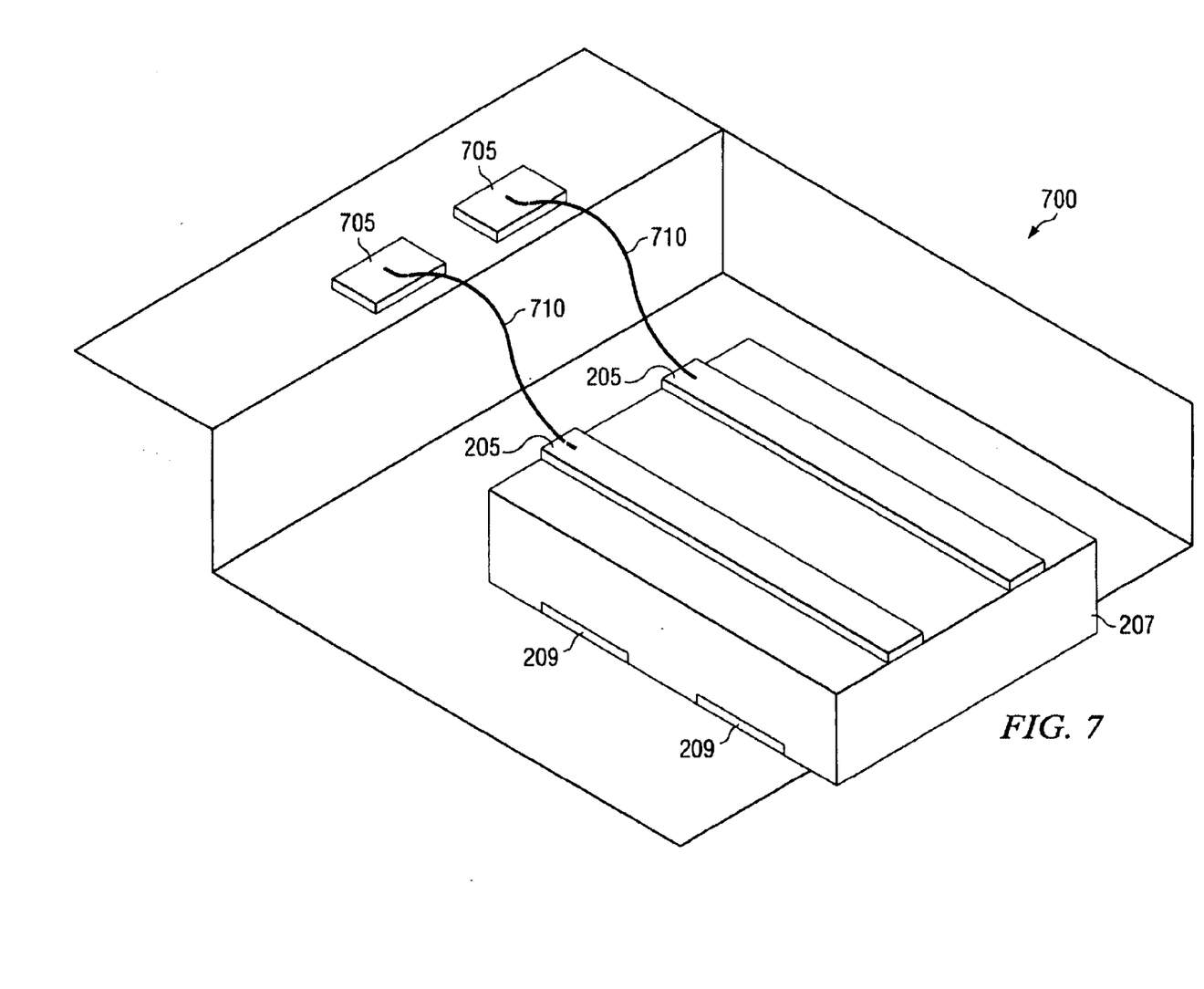
FIG. 7 illustrates an isometric view of a portion of a semiconductor package containing a substrate with a slotted ground plane according to a preferred embodiment of the present invention.

Referring now to FIG. 7, a diagram provides an isometric view of a portion of a semiconductor package 700 containing a substrate with a slotted ground plane according to a preferred embodiment of the present invention. As discussed previously, the substrates are placed into a semiconductor package, connected to pins in the package and then sealed. Once sealed, the packages are ready for use in their intended operation. The package 700 is used to hold and protect the substrate and to provide electrical signals a path into and out of the substrate. FIG. 7 displays a pair of pads 705 that are coupled to the differential pair transmission line 205 via two wires 710. The pads 705 are, in turn, coupled to signal pins (not shown) that are a part of the package 700. The signal pins are used to couple signals into and out of the package 700.

According to another preferred embodiment of the present invention, the slots do not have to be equally spaced beneath the differential pair transmission lines. Additionally, the slots may be formed with different widths and lengths.

While the discussion above focused on the use of differential pairs to bring signals into the integrated circuit and the use of slots cut into the ground plane to increase the common mode rejection ratio, the present invention has application to other uses of differential pair conductors and when increase the common mode rejection ratio.

While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description. It is therefore intended that the appended claims encompass any such modifications or embodiments.

What is claimed is:

1. A substrate comprising:
    a differential pair transmission line;
    an equi-potential plane with slots formed in the equi-potential plane, wherein the slots lie beneath the differential pair transmission line and are disposed perpendicularly to the differential pair transmission line's orientation; and
    a dielectric layer positioned between the differential pair transmission line and the slotted equi-potential plane, the dielectric layer to electrically insulate the differential pair transmission line from the equi-potential plane.

2. The substrate of claim 1, wherein there are a plurality of differential pair transmission lines oriented in a parallel fashion, and each slot formed in the equi-potential plane underneath the parallel differential pair transmission lines extends underneath each of the parallel differential pair transmission line.

3. The substrate of claim 2, wherein electrical signals are carried on the differential pair transmission lines and the electrical signals are clocked at a frequency, and the slots underneath the parallel differential pair transmission lines are less than one half wavelength of the electrical signal carried on the differential pair transmission lines in length.

4. The substrate of claim 1, wherein the substrate is a multilayer substrate with alternating layers of equi-potential planes, dielectric layers, and differential pair transmission lines.

5. The substrate of claim 4, wherein there is a dielectric layer between each equi-potential plane and differential pair transmission line.

6. The substrate of claim 1, wherein the equi-potential plane is set at a voltage level and the voltage level is electrical ground.

7. The substrate of claim 1, wherein the equi-potential plane is set at a voltage level and the voltage level is equal to a power supply voltage for the substrate.

8. The substrate of claim 1, wherein the slots formed in the equi-potential plane are longer in length than the width of the differential pair transmission line.

9. The substrate of claim 1, wherein the differential pair transmission line has a starting point and an ending point and a length between the points, and the slots are formed in the equi-potential plane for the length of the differential pair transmission line.

10. The substrate of claim 1, wherein there are a plurality of differential pair transmission lines, and the equi-potential plane underneath each differential pair transmission line has slots formed in the equi-potential plane, and each slot underneath a differential pair transmission line is perpendicular to the differential pair transmission line.

11. The substrate of claim 1, wherein the equi-potential plane is at a constant voltage potential.

12. The substrate of claim 1, wherein the slots are formed by etching the ground plane.

13. The substrate of claim 1, wherein the slots are formed by cutting the ground plane.

14. The substrate of claim 1, wherein the slots have rounded corners.

15. The substrate of claim 1, wherein the slots differ in size.

16. The substrate of claim 1, wherein the slots are equally spaced underneath the differential pair.

17. The substrate of claim 1, wherein the slots are unequally spaced underneath the differential pair.

18. A semiconductor chip comprising:
    a substrate comprising:
        a differential pair transmission line;
        an equi-potential plane with slots formed in the equi-potential plane, wherein the slots lie beneath the differential pair transmission line and are disposed perpendicularly to the differential pair transmission line's orientation;
        a dielectric layer positioned between the differential pair transmission line and the slotted equi-potential plane, the dielectric layer to electrically insulate the differential pair transmission line from the equi-potential plane; and
    the semiconductor chip further comprising a package to hold the substrate, the package comprising a pad coupled to a pin on the package, the pad to provide electrical connectivity between the pin and the differential pair transmission line.

19. The semiconductor chip of claim 18, wherein the substrate contains a plurality of integrated circuits.

20. The semiconductor chip of claim 19, wherein the substrate is a multi-chip module.

21. The semiconductor chip of claim 18, wherein the differential pair transmission line comprises two conductors, and there is a pad coupled to each conductor of the differential pair transmission line.

22. The semiconductor chip of claim 18, wherein the substrate is a multilayer substrate with alternating layers of equi-potential planes, dielectric layers, and differential pair transmission lines.

23. A method for forming a slotted ground plane comprising:
    forming an equi-potential plane;
    forming slots in the equi-potential plane, such that the slots run perpendicular to a differential pair transmission line;
    forming a dielectric layer on the equi-potential plane; and
    forming the differential pair transmission lines on the dielectric layer.

24. The method of claim 23, wherein the slots are formed by cutting the equi-potential plane.

25. The method of claim 23, wherein the slots are formed by etching the equi-potential plane.

26. The method of claim 23, wherein the slots run perpendicular to the differential pair transmission line for the length of the differential pair transmission line.

* * * * *